(12) United States Patent
Hendriks

(10) Patent No.: US 12,376,237 B2
(45) Date of Patent: Jul. 29, 2025

(54) CONTROLLED DEPOSITION METHOD OF A DONOR MATERIAL ONTO A TARGET SURFACE AND PLATE THEREFOR

(71) Applicant: Nederlandse Organisatie voor toegepast-natuurwetenschappelijk onderzoek TNO, 's-Gravenhage (NL)

(72) Inventor: Rob Jacob Hendriks, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 207 days.

(21) Appl. No.: 17/916,861

(22) PCT Filed: Apr. 1, 2021

(86) PCT No.: PCT/NL2021/050211
§ 371 (c)(1),
(2) Date: Oct. 4, 2022

(87) PCT Pub. No.: WO2021/206541
PCT Pub. Date: Oct. 14, 2021

(65) Prior Publication Data
US 2023/0156926 A1 May 18, 2023

(30) Foreign Application Priority Data
Apr. 7, 2020 (EP) .................................... 20168510

(51) Int. Cl.
*H05K 3/14* (2006.01)
*C23C 14/28* (2006.01)
*H05K 3/10* (2006.01)

(52) U.S. Cl.
CPC .............. *H05K 3/14* (2013.01); *C23C 14/28* (2013.01); *H05K 3/107* (2013.01); *H05K 2203/107* (2013.01)

(58) Field of Classification Search
CPC .. B61D 17/18; B65D 2590/046; B65D 65/40; B65D 90/046; B65D 88/74; B65D 90/06;
(Continued)

(56) References Cited

U.S. PATENT DOCUMENTS

| 2005/0054121 A1 | 3/2005 | Handy et al. |
| 2017/0306495 A1 | 10/2017 | Kotler et al. |
| 2017/0313044 A1 | 11/2017 | Marinov et al. |

FOREIGN PATENT DOCUMENTS

| CN | 201668412 U | 12/2010 |
| JP | 2012094855 A | 5/2012 |
| JP | 2016068412 A | 5/2016 |

(Continued)

OTHER PUBLICATIONS

European Patent Office, International Search Report in corresponding International Application No. PCT/NL2021/050211, dated Jun. 22, 2021 (4 pages).
(Continued)

*Primary Examiner* — Lawrence D Ferguson
(74) *Attorney, Agent, or Firm* — Leydig, Voit & Mayer, Ltd.

(57) ABSTRACT

A method of depositing a donor material onto a target surface is provided herein, in which a first main side of a substrate is covered with a stretchable layer that is attaching thereto with a sealing around an enclosed area at the first main side, therewith defining an enclosure. The stretchable layer has an outer surface that faces away from the substrate, and that is patterned with one or more recessed areas filled with the donor material to be deposited. A relatively high pressure is provided in an interior of the enclosure so that its volume is increased and the patterned surface of the stretchable layer is pressed against the target surface. In that state of the stretchable layer the substrate is irradiated at a second main side opposite its first main side with photon radiation that has an intensity and a duration that causes a transfer of donor material from the one or more recessed areas to the target surface. Also a plate and a deposition device are provided.

5 Claims, 5 Drawing Sheets

(58) Field of Classification Search
CPC ........ F16L 59/02; F16L 59/029; C23C 14/28;
H05K 2201/0162; H05K 2201/09036;
H05K 2201/09827; H05K 2203/0528;
H05K 2203/107; H05K 3/107; H05K 3/14

See application file for complete search history.

(56) References Cited

FOREIGN PATENT DOCUMENTS

| | | |
|---|---|---|
| JP | 2019530017 A | 10/2019 |
| WO | WO 2010/081137 A2 | 7/2010 |

OTHER PUBLICATIONS

Hongyu Luo et al., Research Article, "Laser-driven programmable non-contact transfer printing of objects onto arbitrary receivers via an active elastomeric microstructured stamp," National Science Review, 7: pp. 296-304 (2020).

Andrew Carlson et al., "Active, Programmable Elastomeric Surfaces with Tunable Adhesion for Deterministic Assembly by Transfer Printing," Advanced Functional Materials, 2012, 22, pp. 4476-4484, Full Paper (2012).

Kyoseung Sim et al., "Three-dimensional curvy electronics created using conformal additive stamp printing," Nature Electronics, vol. 2, pp. 471-479 (Oct. 2019).

Japanese Patent Office, Notice of Reasons for Rejection in corresponding Japanese Application No. 2022-561617 dated Apr. 22, 2025.

Japanese Patent Office, Decision to Grant in corresponding Japanese Patent Application No. 2022-561617 dated Jun. 10, 2025 (3 pages) (translation not available).

CONTROLLED DEPOSITION METHOD OF A DONOR MATERIAL ONTO A TARGET SURFACE AND PLATE THEREFOR

CROSS-REFERENCE TO RELATED APPLICATIONS

This patent application is a U.S. National Phase of PCT International Application No. PCT/NL2021/050211, filed Apr. 1, 2021, which claims priority to European Application No. 20168510.4, filed Apr. 7, 2020, which are both expressly incorporated by reference in their entireties, including any references contained therein.

BACKGROUND

The present application pertains to a method for controlled deposition of a donor material onto a target surface.

The present application further pertains to a plate comprising a donor material to be deposited onto a target surface.

The present application still further pertains to a deposition device comprising such a plate.

A method for controlled deposition of a donor material onto a target surface is known from US2017268107. According to the method disclosed therein, an optically transparent plate having a first surface with one or more wells and a second surface opposite the first surface is provided. After coating the first surface with a thin layer of light-absorbing material, the wells are filled with a donor material. The plate is then irradiated from the second surface with a pulsed light to induce heat in the well and in order to generate gas to transfer the donor material from the well onto a receiving substrate located adjacent to the plate. In this process, the heat flux around the well will determine how the donor material is be ejected.

The known method is very suitable for depositing a donor material on flat surfaces. There is a need however for a method that is also suitable for use with uneven surfaces. Such a situation may arise for example if the target comprises a plurality of layers and the donor material is deposited to provide for an electric connection between one product layer and a portion of another product layer extending below that one product layer. In another example, an electric connection is to be formed between a component carrier and electric terminals of a component arranged on the component carrier.

Reference is made further to the following prior art.

Hongyu Luo ET AL: "Laser-driven programmable non-contact transfer printing of objects onto arbitrary receivers via an active elastomeric microstructured stamp", National science review, 6 Aug. 2019, pages 296-304, XP055728788, DOI: 10.1093/nsr/nwz109 Retrieved from the Internet: URL: https://academic.oup.com/nsr/article-pdf/7/2/296/32921935/nwz109.pdf [retrieved on 2020 Sep. 8]. Hongyu Luo ET AL disclose a laser-driven programmable non-contact transfer printing technique using an active elastomeric microstructured stamp that features cavities filled with air and embedded under the contacting surface, a micro-patterned surface membrane that encapsulates the air cavities and a metal layer on the inner-cavity surfaces serving as the laser-absorbing layer. The micro-patterned surface membrane can be inflated dynamically to control the interfacial adhesion, which can be switched from strong state to weak state by more than three orders of magnitude by local laser heating of the air in the cavity with a temperature increase below 100° C.

WO 2010/081137 A2 provides an imaging array fabrication process method, comprising fabricating an array of semiconductor imaging elements, interconnecting the elements with stretchable interconnections, and transfer printing the array with a pre-strained elastomeric stamp to a secondary non-planar surface.

US 2017/306495 A1 specifies an apparatus for material deposition on an acceptor surface that includes a transparent donor substrate having opposing first and second surfaces, such that at least a part of the second surface is not parallel to the acceptor surface. The transparent donor substrate has a donor film on the second surface. An optical assembly is configured to direct a beam of radiation to pass through the first surface of the donor substrate and impinge on the donor film at a location on the part of the second surface that is not parallel to the acceptor surface, so as to induce ejection of droplets of molten material from the donor film onto the acceptor surface.

SUMMARY

It is an object of the present application to provide an improved deposition method suitable for deposition of a donor material onto an uneven target surface. In accordance therewith a method is provided as claimed in claim 1.

It is a further object of the present application to provide an improved plate for use in the improved method. In accordance therewith a plate is provided.

It is a still further object of the present application to provide an improved deposition device that is suitable for deposition of a donor material onto an uneven target surface. In accordance therewith an improved device is claimed.

The improved method as claimed in claim 1 comprises the following steps.

A first main side of a substrate is covered with a stretchable layer. The stretchable layer, e.g from a stretchable polymer like PDMS (Polydimethylsiloxane) or PU (Polyurethane), is attached thereto with a sealing around an enclosed area at the first main side. Therewith an enclosure is defined.

The stretchable layer has an outer surface facing away from the substrate that is patterned with one or more recessed areas, such as grooves, trenches, and wells.

The one or more recessed areas are filled with the donor material that is to be deposited on the target surface.

Subsequently, a relatively high pressure is provided in an interior of the enclosure as compared to a pressure in an exterior of the enclosure. For example pressurized gas or air is supplied inside the interior and/or an environment wherein the plate is arranged is evacuated. Also it may be contemplated to evaporate a substance in the interior to induce an increased vapor pressure therein. As a result of providing the relatively high pressure, a volume of the interior is increased so that the patterned surface of the stretchable layer is pressed against the target surface.

With the patterned surface of the stretchable layer being pressed against the target surface the substrate is irradiated with photon radiation at a second main side opposite its first main side. The photon radiation has an intensity and a duration that causes a transfer of donor material from the one or more recessed areas to the target surface. The photon radiation is transmitted through the substrate and the stretchable layer to within the one or more recessed areas, where it induces a vapor pressure at an interface of the donor material facing the flexible layer that results in an ejection of the donor material out of the one or more recessed areas towards the target surface. Due to the relatively high pressure in the enclosure, the stretchable layer is forced to conform to the uneven shape of the target surface. As a result, the patterned surface with the one or more recessed areas comprising the donor material are in close contact with the target surface, therewith providing for a good transfer accuracy.

In some embodiments the vapor pressure is induced by evaporation of the donor material. In other embodiments an auxiliary material is provided at the interface that is more easily evaporated than the donor material. Additionally or alternatively, an auxiliary material may be provided at the interface that has a relatively high absorption for the photon radiation that is used.

In embodiments the donor material is a viscous substance, so that it can easily deform in accordance with the deformation induced in the stretchable layer. In some of these embodiments the intensity and duration of the photon radiation is selected to at least partially cure the donor material. As in these embodiments, at least the donor material at the interface with the stretchable layer surface is at least partially cured, it is avoided that portions of donor material remain at the stretchable layer surface. In preferred embodiments the donor material is even fully cured while it is ejected towards the target surface.

Once the donor material is deposited onto the target surface, the stretchable layer can be released from the target surface. To that end, the plate may be pulled away from the target surface. In some embodiments, the enclosure is deflated by providing for a relatively low pressure in its interior as compared to a pressure in its exterior. E.g. the interior is evacuated and/or the exterior is pressurized. Once the plate with the stretchable layer is removed from the target surface, it can be made ready for reuse by refilling the recessed areas in the stretchable layer. In some cases, refilling is preceded by the step of cleaning the surface of the stretchable layer.

The improved plate comprises a substrate with a first and a second mutually opposite main sides. The first main side of the substrate is covered with a patterned layer that has a patterned surface to be directed towards the target surface. The patterned surface is patterned with one or more recessed areas that are filled with the donor material for deposition on the target surface.

The second main side of the substrate is to receive photon radiation that is to be transmitted through the substrate towards the recessed areas with the donor material. In use the photon radiation has an intensity and a duration that causes a transfer of donor material from the one or more recessed areas to the target surface.

The improved plate is characterized in that the patterned layer is of a stretchable material which is attached to said the first main side of the substrate with a sealing around an enclosed area at the first main side. Therewith an enclosure is defined with an interior and an exterior. The interior has a volume dependent on a difference in pressure in the interior relative to that in the exterior.

In some embodiments the plate has an opening that extends towards the interior of the enclosure, so that the pressure in the interior of the enclosure can be easily controlled. In some examples thereof the opening extends through the substrate. In other examples, the opening extends through the sealing or through the stretchable layer.

In some embodiments of the improved plate, the stretchable layer is reinforced with relatively rigid elements. Therewith the deformation can be controlled to therewith improve an alignment accuracy, while still allowing the stretchable layer to conform to the target surface. The relatively rigid elements may for example restrict deformation of the stretchable layer in the neighborhood of the recessed areas. As another example, the relatively rigid elements may be relatively rigid only in one direction and be more flexible in a direction transverse thereto.

In an example of these embodiments, the one or more relatively rigid elements locally prevent stretching, but preserve flexibility, and the one or more relatively rigid elements are provided at a side facing away from the substrate with a dielectric coating that provides for an at least substantially uniform heatflux within the recessed portions, in that the dielectric coating has a higher reflectivity for monochromatic photon radiation with a predetermined wavelength incident on a bottom wall of a recessed portion than a reflectivity for said monochromatic radiation incident on a side wall of said recessed portion. The application of the relatively rigid elements in this example, mitigates a damage of the dielectric coating when a pressure is exerted in the interior relative to the exterior of the enclosure. A more detailed description of exemplary dielectric coatings for this purpose is provided in European patent application 20167549.3 filed by the same applicant.

In some embodiments of the plate the stretchable layer is attached to the first main side of the substrate at further positions within the enclosed area as an alternative or additional measure to control deformation.

In some embodiments, the stretchable layer is attached to the first main side of the substrate at further positions within the enclosed area to locally restrict deformations.

In some embodiments of the improved plate a plurality of enclosures is formed on the substrate. The plurality of enclosures either have a respective stretchable layer or have a respective portion of a stretchable layer that is attached to the substrate with a respective enclosing sealing. In these embodiments, the inflation of the enclosures formed therewith can be independently controlled. In case a single stretchable layer is used, its deformation is controlled more strictly than in case it would be attached to the substrate by a single sealing. In variants of these embodiments a stretchable layer or a stretchable layer portion of an enclosure is attached to the first main side of the substrate at further positions within its enclosed area.

The deposition device provided herein, comprises in addition to an embodiment of the improved plate in addition a holder, a photon radiation source, a pressure regulation facility and a controller.

The photon radiation source is provided to render the photon radiation to be directed towards the second side of the plate.

The pressure regulation facility is provided to controllably induce a pressure difference between the interior of the enclosure relative to its exterior. To that end, in some embodiments, the pressure regulation facility is configured to control a pressure in the interior of the enclosure by evacuation of the interior of the enclosure and/or by supplying a gas or mixture of gasses, e.g. air in the interior of the enclosure. In some other embodiments, the pressure regulation facility is configured to control a pressure in the exterior of the enclosure by evacuation of the exterior of the enclosure and/or by supply a gas or a mixture of gasses, e.g. air into the exterior. In again some other embodiments the pressure regulation facility is configured to regulate a pressure in the interior and in the exterior.

The holder is provided to hold a target with a target surface facing the first surface of the plate. In some embodiments the holder is configured to hold the target at a fixed position relative to the plate. In other embodiments the holder is configured to move the target. The deposition device may be configured to position a fresh plate or a fresh portion of the plate in front of the radiation source and to position a subsequent portion of the target surface in front of the first surface of the fresh plate or fresh portion of the plate subsequent to a deposition step.

The controller is provided to control the pressure regulation facility and the photon radiation source. The controller has a first operational mode wherein it controls the pressure regulation facility to maintain a pressure inside said interior that is lower than said external pressure and wherein in maintains the photon radiation source in a deactivated state. The controller has a second operational mode wherein it controls the pressure regulation facility to maintain a pressure inside said interior that is higher than said external pressure. Therewith it presses the patterned layer towards the target surface, and with the patterned layer pressed against the target surface it causes the radiation source to render the photon radiation with an intensity and a duration that causes a transfer of donor material from the one or more recessed areas to the target surface. The duration of the heat irradiation is typically short, e.g. in terms of microseconds, but usually even shorter, i.e. in terms of nano-seconds. In practice good results with modest technical requirements may be obtained with a pulse duration in the order of a few to a few tens of ns. Nevertheless, in some cases an even shorter pulse duration may be applied, e.g. in the range of 10-500 ps. In a test phase the intensity can be varied from a relatively low value (e.g. corresponding to an exposure (fluence) of about 0.1 J/cm2) to a relatively high value (e.g. corresponding to an exposure (fluence) of about 1 J/cm2) to determine for which value or value range the transfer of the donor material is optimal in terms of deposition accuracy. As noted above, in some embodiments, the intensity and duration of the photon radiation is selected to at least partially cure the donor material at the interface with the walls of the recessed area from which it is ejected.

BRIEF DESCRIPTION OF THE DRAWINGS

FIG. 1A is a plane view of the plate and FIG. 1B is a cross-section according to IB-IB in FIG. 1A;

DETAILED DESCRIPTION OF EMBODIMENTS

Figure 1A:
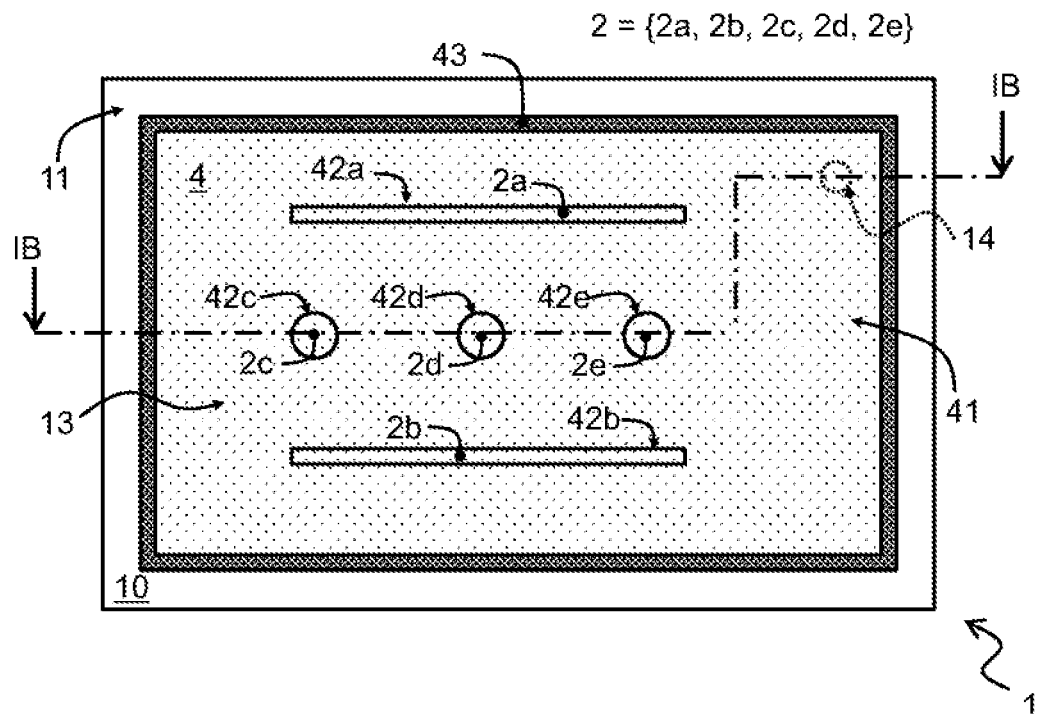
FIG. 1A, 1B schematically show an embodiment of the plate as claimed herein. Therein
Figure 1B:
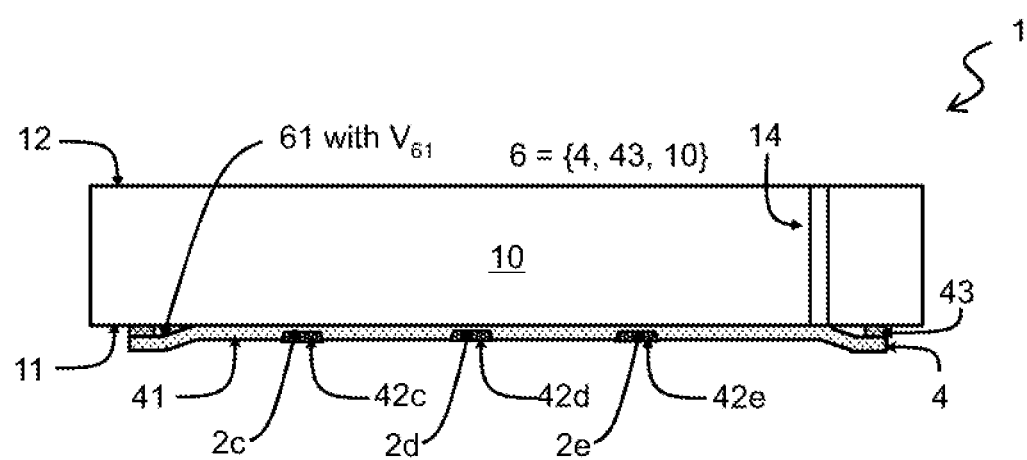
Figure 2A:
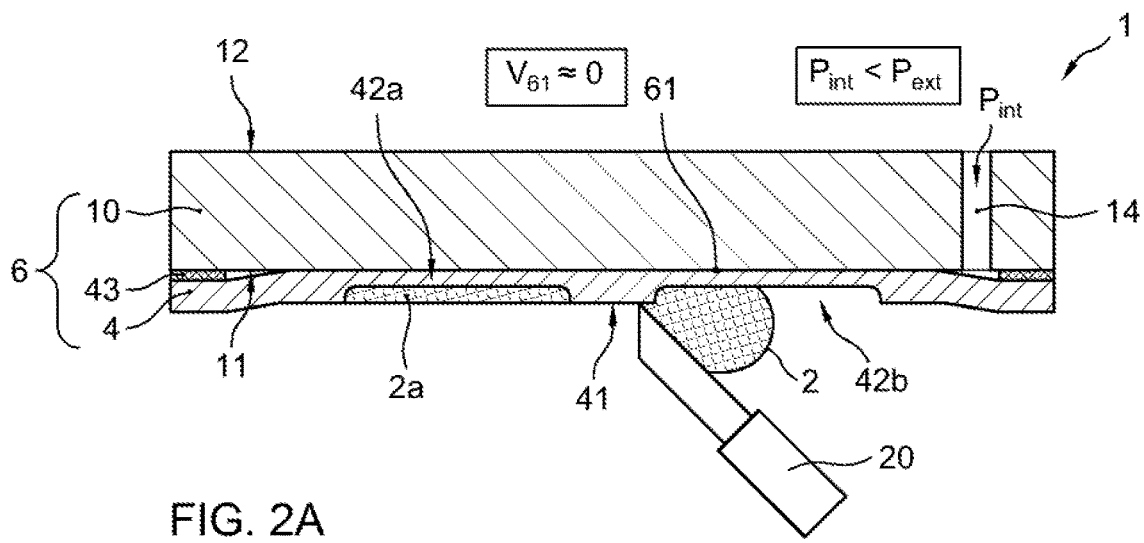
FIG. 2A-2D illustrate steps of an embodiment of the method as claimed.
Figure 2B:
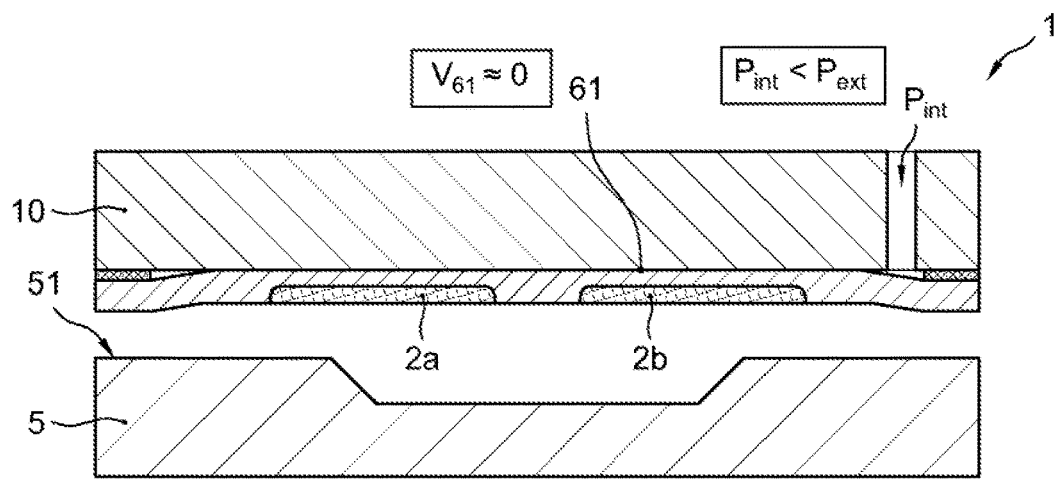

FIG. 1A, 1B schematically shows a plate 1 that comprises a donor material 2 to be deposited onto a target surface 51 (See FIG. 2B) of a target 5 (FIG. 2B). Therein FIG. 1B shows a cross-section according to IB-IB in FIG. 1A. The plate comprises a substrate 10 with a first main side 11 and a second main sides opposite thereto. The first main side 11 of the substrate 10 is covered with a patterned layer 4 that has a patterned surface 41 that is to be directed towards the target surface. The patterned surface 41 is patterned with one or more recessed areas. In the example of FIG. 1A, 1B these comprise a first and a second trench 42a, 42e that are each filled with a proper portion 2a, 2b of the donor material 2. In this example, the one or more recessed areas also comprise wells 42c, 42d, and 42e that are also filled with a proper portion 2c, 2d, 2e of the donor material 2.

In use, the second main side 12 of the plate 1 is to receive photon radiation to be transmitted through the substrate 10 towards the donor material. The photon radiation applied in said use has an intensity and a duration that causes a transfer of the donor material 2a, . . . , 2e from the one or more recessed areas 42a, . . . , 42e to the target surface 51 of the target (also denoted as acceptor) 5. The patterned layer 4 is of a stretchable material and it is attached to the first main side 11 with a sealing 43 around an enclosed area 13 at the first main side 11. Therewith the substrate 10, the sealing 43 and the layer of a stretchable material 4 define an enclosure 6 with an interior 61 and an exterior 62 (See FIG. 5). The interior has a volume $V_{61}$ dependent on a difference between a pressure $P_{int}$ in the interior 61 and the pressure $P_{ext}$ in the exterior 62.

An embodiment of a method using the plate 1 is described with reference to FIG. 2A-2E.

In a manufacturing step, not shown here, a first main side 11 of a substrate 10 is covered with a stretchable layer 4. The stretchable layer 4 is attached to the first main side 11 with a sealing 43 that is provided around an enclosed area 13 at the first main side 11. In some embodiments, the sealing is provided as an epoxy-based adhesive. In other embodiments, the material of the stretchable layer 4 forms itself a sealing. This is possible if the surface at the first main side 11 of the substrate 10 is locally roughened where the sealing is to be formed and the stretchable layer is mechanically adhered to the locally roughened surface. The substrate 10, the stretchable layer 4 and the sealing 43, either formed by the material of the stretchable layer itself or formed by a separate material, forms an enclosure 6 with an interior 61 and an exterior 62. The stretchable layer 4 has an outer surface 41, facing away from the substrate 10, that is patterned with one or more recessed areas. In FIG. 2A, by way of example the recessed areas 42a, 42b area shown.

In a subsequent step the one or more recessed areas are filled with the donor material 2 to be deposited. In the example shown the recessed area 42a is already filled with a portion 2a of the donor material, and the recessed area 42b is being filled with another portion 2b of the donor material, here using a doctor blade 20. Exemplary donor materials for deposition are copper, aluminum, tungsten, chromium, polysilicon provided as particles in a suspension medium, which may further comprise a solvent and a binder. Other materials than metals are also suitable for use as a donor material. The donor material may for example be provided as an ink wherein conductive particles are suspended. Rheological properties of the donor material may be modified by additives or solvent, for example to obtain a shear-thickening, a shear-thinning, a thixotropic, a rheopectic or a Bingham plastic behavior. By way of example, the donor material is a viscous silver nanoparticle ink with a high metal load. In some embodiments the viscosity of the donor material is in a range of 100-1000 Pa·s.

When filling the recessed areas with the donor material, the interior 61 of the enclosure is typically held at a relatively low pressure $P_{int}$, i.e. lower than the pressure $P_{ext}$ prevailing in the exterior. This can be achieved by evacuating the interior 61, and/or by pressurizing the exterior.

FIG. 2B shows the plate 1 having the recessed areas filled with the donor material 2a, 2b and with the interior 61 of the enclosure still held at a relatively low pressure. FIG. 2B further shows the target (acceptor) 5. As shown in FIG. 2B. the target 5 has an uneven surface 51.

Figure 2C:
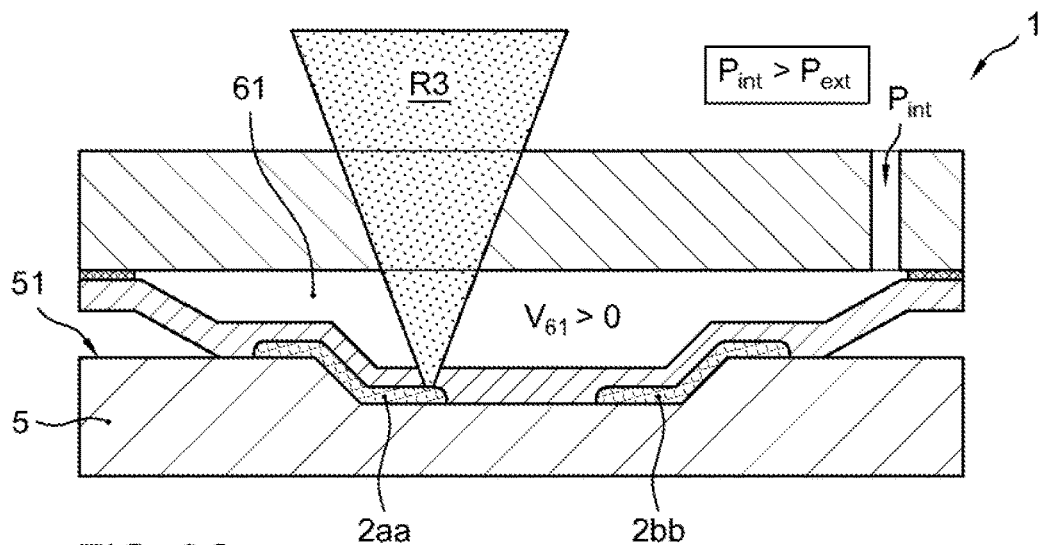

FIG. 2C shows a next step, wherein a pressure $P_{int}$ is provided in the interior 61 of the enclosure 6 that is higher than a pressure $P_{ext}$ in the exterior of the enclosure. Therewith a volume $V_{61}$ of the interior 61 is increased and the patterned surface 41 of the stretchable layer 4 is pressed against the target surface 51, so that its shape becomes compliant with that of the target surface.

FIG. 2C also shows that in this state the second main side 12 of the substrate 10 is irradiated with photon radiation having an intensity and a duration that causes a transfer of donor material 2a, 2b from the recessed areas 42a, 42b to the target surface 51. The transferred donor material 2a, 2b therewith forms elements 2aa, 2bb on the target surface. Due to the fact that the stretchable layer 4 in this state conforms to the target surface 51, the donor material can be very accurately deposited thereon.

Figure 2D:
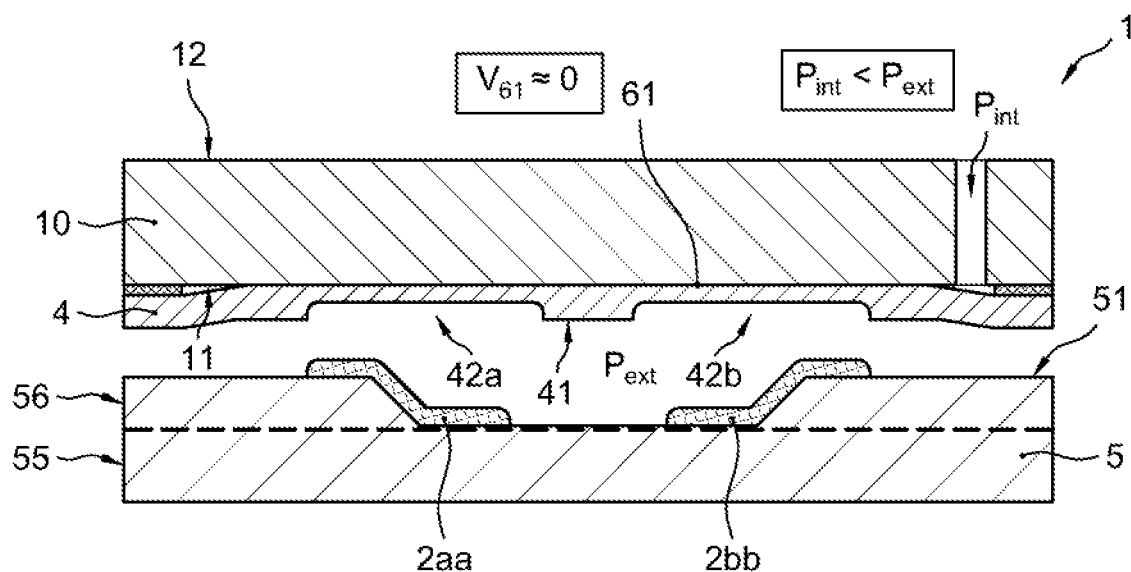

FIG. 2D shows how the stretchable layer 4 is released from the target surface 51 by providing for a pressure $P_{int}$ in the interior 61 of the enclosure 6 that is lower than a pressure $P_{ext}$ in the exterior. Therewith the elements 2aa, 2bb formed by the deposited donor material remain at the target surface 51. In the example shown the target surface is uneven, for example in that the target 5 comprises a plurality of layers 55, 56. The elements 2aa, 2bb are for example electrical connections between these layers 55, 56.

Figure 2E:
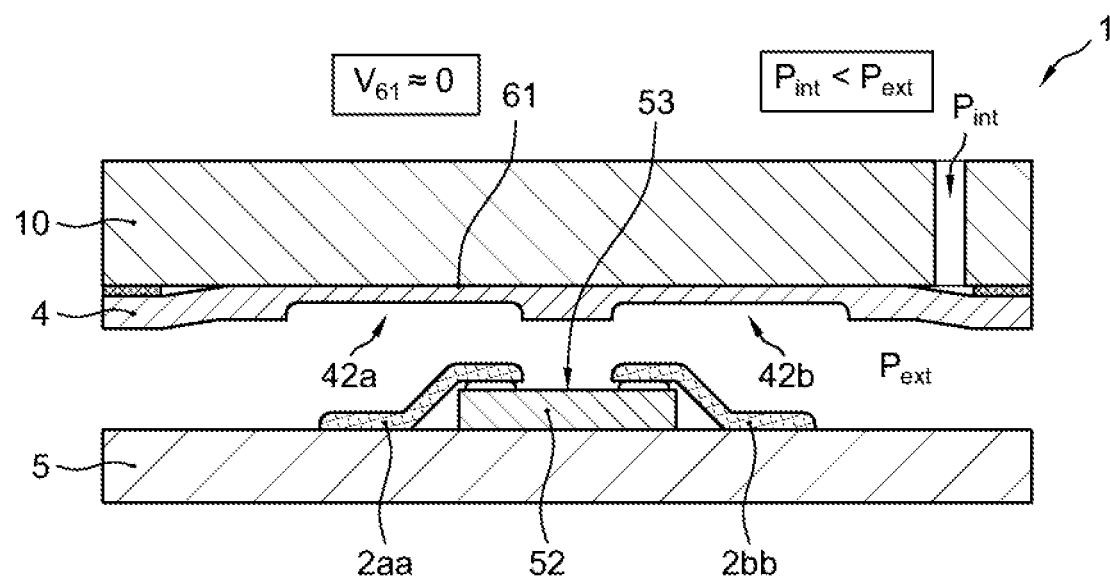
FIG. 2E illustrates an alternative application of the method.

FIG. 2E shows another example, wherein a component 52 is mounted on a component carrier 5, and wherein the method was used to apply electrical connections 2aa, 2bb between the component carrier 5 and contacts at a component surface 53 elevated above the carrier 5.

Figure 3:
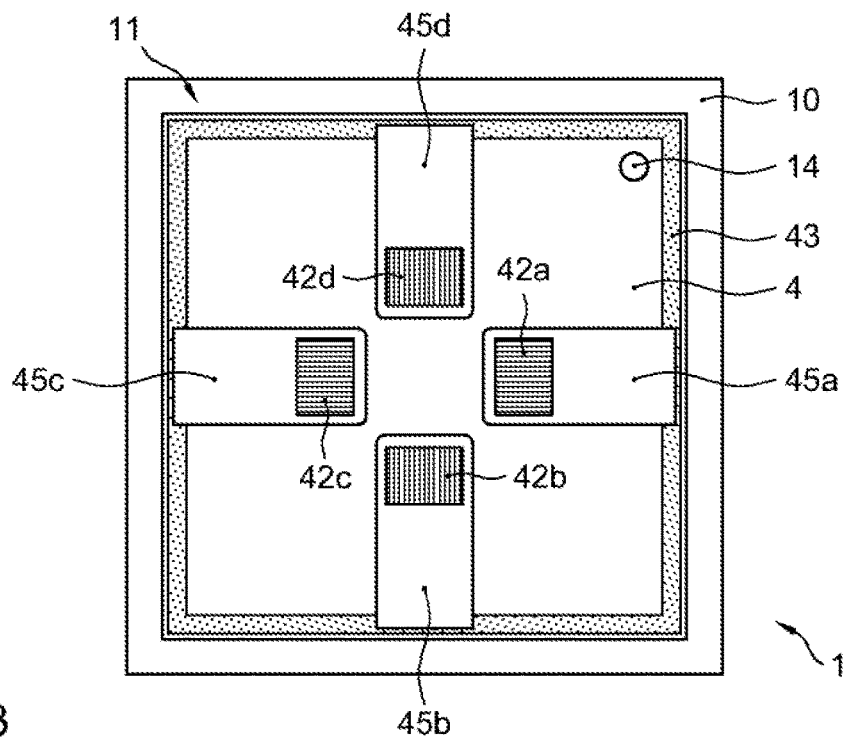
FIG. 3 shows an alternative embodiment of the plate as claimed.

FIG. 3 shows an alternative embodiment of the improved plate 1, as seen at the first side 11 of the substrate 10. Parts therein corresponding to those in the preceding figures have the same reference in the drawing. In the embodiment shown in FIG. 3, the stretchable layer 4 is reinforced with relatively rigid elements 45a, 45b, 45c, 45d. The recessed areas 42a, . . . , 43d are provided in the reinforced portions of the stretchable layer. Therewith a deformation of the stretchable layer 4 to comply with a target surface is still possible, but local deformations in the neighborhood of the recessed areas are mitigated. In exemplary embodiments the reinforcement locally prevents stretching, but preserves flexibility. This is for example the case in an embodiment wherein the reinforced portions with the recessed areas are provided of a relative thin glass layer, e.g. a SiO2 layer, for example having a thickness in the range of 5-10 micron. These locally flexible, but non-stretchable portions may be provided at a side facing away from the substrate with a dielectric coating that provides for a uniform heatflux within the recessed portions as specified in more detail in European patent application 20167549.3 filed by the same applicant. Alternatively, or additionally, the stretchable layer 4 may be reinforced in regions outside the recessed areas. Alternatively, or additionally the stretchable layer 4 may be attached to the first main side 11 of the substrate 10 at further positions within the enclosed area to control the way in which it can be deformed by pressure differences.

Figure 4:
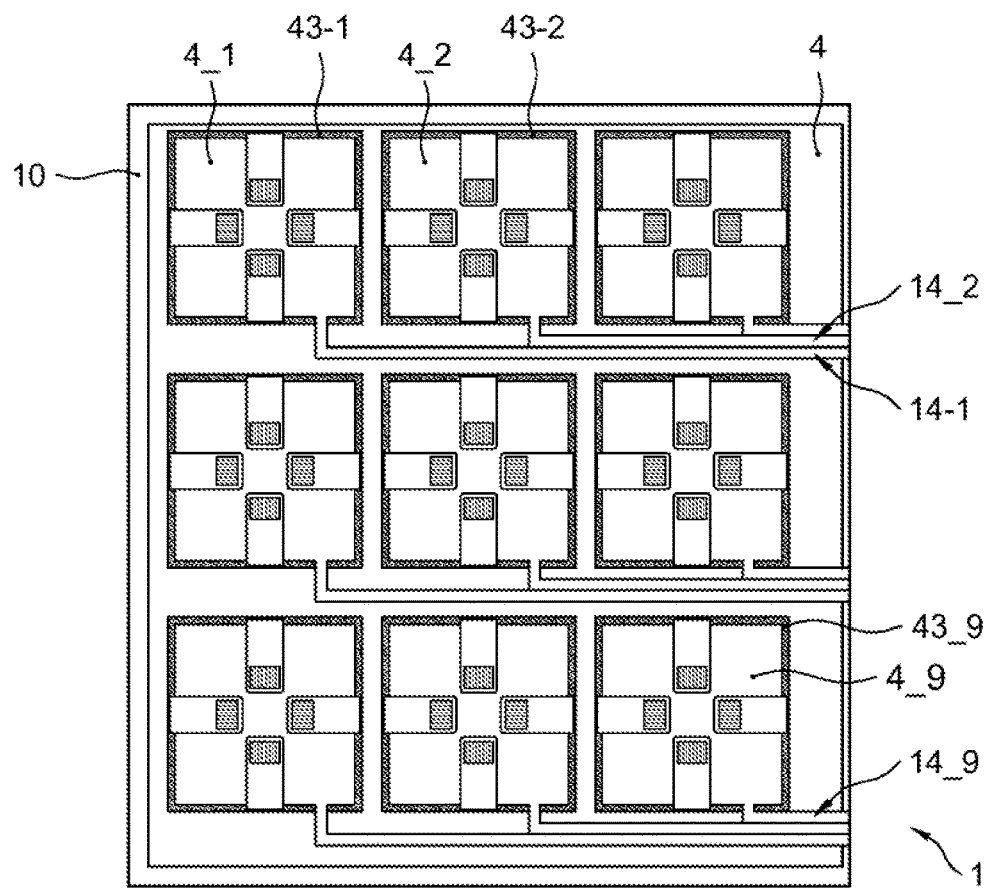
FIG. 4 shows another alternative embodiment of the plate as claimed.

As shown in FIG. 4, a plurality of enclosures is formed on the substrate 10. Each enclosure has a proper stretchable layer portion 4_1, 4_2, . . . , 4_9 of a stretchable layer 4 that is attached to the substrate with a proper enclosing sealing 43_1, 43_2, . . . , 43_9. The internal pressure in these enclosures can be independently controlled via respective channels 14_1, 14_2, . . . , 14_9. In the example shown, the stretchable layer portions are locally reinforced in the same way as shown in FIG. 3. In other embodiments, a reinforcement may be absent. Whereas in the example of FIG. 4 a single stretchable layer 4 is used, alternative embodiments exist wherein one or more enclosures have a proper stretchable layer. It may be contemplated to use different stretchable materials for different enclosures dependent on their position on the plate 1.

Figure 5:
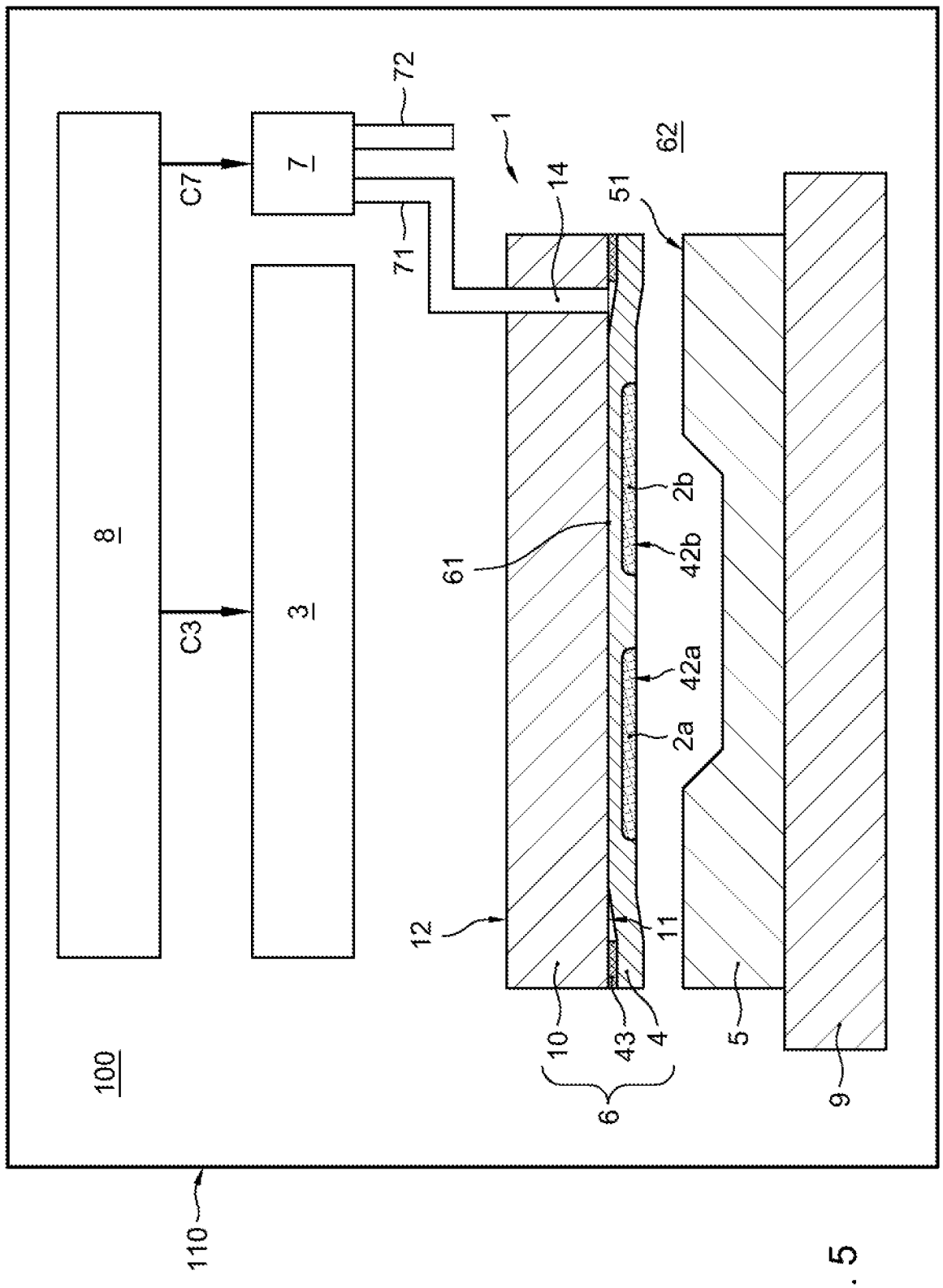
FIG. 5 shows an embodiment of a deposition device as claimed.

FIG. 5 schematically shows a deposition device 100 comprising an improved plate 1, for example as shown in and described with reference to one of the preceding figures.

The deposition device 100 further comprises a holder 9 to hold a target 5 with a target surface 51 facing the first surface 11 of the plate 1. The deposition device 100 further comprises a photon radiation source 3 to render the photon radiation that is to be directed towards the second side 12 of the plate 1, as shown in FIG. 2C.

The deposition device 100 also comprises a pressure regulation facility 7 to controllably induce a pressure difference between said interior 61 relative to the exterior 62. In the embodiment shown, the pressure regulation facility 7 is coupled via a first conduct 71 and an opening 14 in the plate 1 to the interior 61 of the enclosure 6. The components of the deposition device 100 are arranged in a closed housing 110, that confines the exterior 62 of the enclosure 6. The pressure regulation facility 7 has a second conduct 72 with an opening in the exterior 62. Therewith, the pressure regulation facility 7 can both control a pressure inside the interior as well as a pressure inside the exterior 62. In other embodiments the pressure regulation facility 7 controls one of the pressures. For example an embodiment of the device 100 not having a closed housing, the pressure regulation facility 7 is used to control the pressure in the interior 61 of the enclosure 6 only.

The deposition device 100 comprises a controller 8 to control the pressure regulation facility 7 and the photon radiation source 3, in FIG. 5 with a control signal C3 and a control signal C7 respectively.

The controller 8 has a first operational mode wherein it controls the pressure regulation facility 7 to maintain a pressure inside the interior 61 that is lower than the pressure in the exterior 62, and wherein in maintains the photon radiation source 3 in a deactivated state. The controller has a second operational mode wherein it controls the pressure regulation facility 7 to maintain a pressure inside the interior 61 that is higher than the pressure in the exterior 62. Therewith the stretchable patterned layer 4 is pressed towards the target surface 51. With the stretchable patterned layer 4 pressed against the target surface 51 as shown in FIG. 2C, it causes the radiation source 3 to render photon radiation R3 with the proper intensity and duration that causes a transfer of donor material 2a, 2b from the one or more recessed areas 42a, . . . , 42e to the target surface 51. Various options are available. In one option a large area of the second side 12 of the plate is irradiated with the proper intensity and duration that causes a simultaneous transfer of donor material in the recessed areas of the plate. By way of example, in that case an excimer laser is used as the photon radiation source 3. Alternatively, a scanning laser is used that generates a laser beam that is scanned over the area with the donor material to be transferred as is schematically shown in FIG. 2C. Also in this case the laser can be a pulsed laser, but that is not necessary. In this case the duration with which the area is locally exposed to the radiation can alternatively (or additionally) be controlled with the speed with which the laser beam is scanned. Therewith the exposure duration is inversely proportional to the scanning speed.

Typically the controller 8 has a transient operational mode in which the photon radiation source 3 is kept in a deactivated state as long as the state wherein the stretchable patterned layer 4 is compliant with the target surface 51 is not yet achieved. Typically the controller 8 also has a release operational mode in which the stretchable patterned layer 4 is released from the target surface 51, by reducing the relative pressure (relative to the external pressure) prevailing in the interior 61 as shown in FIGS. 2D and 2E.

Further embodiments of the deposition device are provided with transport facilities to automatically replace the plate 1 by a fresh plate and to replace the target 5 by a new target once it has received the donor material. The controller 8 can therewith control such transport facilities.

The invention claimed is:

1. A plate for deposition of a donor material onto a target surface, the plate comprising:
    a substrate including:
        a first main side; and
        a second main side that is opposite the first main side,
    wherein the first main side is covered with a patterned layer having a patterned surface configured to be directed towards the target surface, and the patterned surface is patterned with one or more recessed areas configured to be filled with the donor material,
    wherein the second main side is configured to receive photon radiation suitable to be transmitted through the substrate so as to enable a transfer of donor material from the one or more recessed areas to the target surface by providing the photon radiation to the second main side at an intensity and for a duration that is sufficient to cause the transfer,
    wherein the patterned layer is made of a stretchable material that is attached to the first main side with a sealing around an enclosed area at said first main side, therewith defining an enclosure having an interior and an exterior,
    wherein the interior of the enclosure has a volume that is dependent on a difference in a pressure in the interior relative to a pressure in the exterior, and
    wherein an opening extends through the substrate towards the interior of the enclosure.

2. The plate according to claim 1, wherein the stretchable layer is reinforced with one or more relatively rigid elements.

3. The plate according to claim 2, wherein the one or more relatively rigid elements locally prevent stretching, but preserve flexibility, and
    wherein the one or more relatively rigid elements are provided at a side facing away from the substrate with a dielectric coating that provides for an at least substantially uniform heatflux within the recessed portions, in that the dielectric coating has a higher reflectivity for monochromatic photon radiation with a predetermined wavelength incident on a bottom wall of a recessed portion than a reflectivity for said monochromatic radiation incident on a side wall of the recessed portion.

4. The plate according to claim 1, wherein the stretchable layer is attached to the first main side of the substrate at further positions within the enclosed area.

5. The plate according to claim 1, wherein a plurality of enclosures is formed on the substrate, each one of the plurality of enclosures having a respective stretchable layer or portion attached to the substrate with a respective enclosing sealing.

* * * * *